US008421221B2

(12) United States Patent
Filoteo, Jr. et al.

(10) Patent No.: US 8,421,221 B2
(45) Date of Patent: Apr. 16, 2013

(54) INTEGRATED CIRCUIT HEAT SPREADER STACKING SYSTEM

(75) Inventors: Dario S. Filoteo, Jr., Singapore (SG); Emmanuel Espiritu, Singapore (SG); Philip Lyndon Cablao, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 40 days.

(21) Appl. No.: 12/781,772

(22) Filed: May 17, 2010

(65) Prior Publication Data

US 2010/0224991 A1 Sep. 9, 2010

Related U.S. Application Data

(62) Division of application No. 11/456,846, filed on Jul. 11, 2006, now Pat. No. 7,759,169.

(51) Int. Cl.
*H01L 23/34* (2006.01)
*H01L 23/28* (2006.01)

(52) U.S. Cl.
USPC ..... 257/719; 257/718; 257/796; 257/E21.499

(58) Field of Classification Search ............... 257/718, 257/719, 796, E21.499; 438/122
See application file for complete search history.

(56) References Cited

U.S. PATENT DOCUMENTS

| | | | |
|---|---|---|---|
| 5,200,809 A | 4/1993 | Kwon | |
| 5,206,792 A | 4/1993 | Reynolds | |
| 5,504,652 A | 4/1996 | Foster et al. | |
| 5,621,615 A | 4/1997 | Dawson et al. | |
| 5,930,114 A * | 7/1999 | Kuzmin et al. | 361/704 |
| 5,977,626 A * | 11/1999 | Wang et al. | 257/707 |
| 6,219,238 B1 | 4/2001 | Andros et al. | |
| 6,424,031 B1 | 7/2002 | Glenn | |
| 6,681,482 B1 | 1/2004 | Lischner et al. | |
| 6,870,246 B1 | 3/2005 | Mullen et al. | |
| 6,933,602 B1 | 8/2005 | Patel et al. | |
| 7,180,745 B2 | 2/2007 | Mandel et al. | |

* cited by examiner

*Primary Examiner* — Shouxiang Hu
(74) *Attorney, Agent, or Firm* — Ishimaru & Associates LLP

(57) ABSTRACT

An integrated circuit heat spreader stacking system includes: an integrated circuit on a substrate; a heat spreader having a heat sink dome; a stacking stand-off for the heat spreader; and the heat spreader mounted with the heat sink dome over the integrated circuit.

9 Claims, 4 Drawing Sheets

INTEGRATED CIRCUIT HEAT SPREADER STACKING SYSTEM

CROSS-REFERENCE TO RELATED APPLICATION(S)

This is a divisional of U.S. patent application Ser. No. 11/456,846 filed Jul. 11, 2006, now U.S. Pat. No. 7,759,169.

TECHNICAL FIELD

The present invention relates generally to integrated circuit packaging, and more particularly to a system for packaging integrated circuits with a heat spreader.

BACKGROUND ART

The electronics industry has spent the last decade packing more and more function into less space. In order to facilitate that continued trend, innovative ways to extract heat from the integrated circuits have come to the fore. These approaches adhere a metal heat spreader to the integrated circuit with a thermal epoxy. The thermal path, established by this mechanism, removes heat generated by the integrated circuit from the package. This is an essential function and has a direct impact on the reliability of the integrated circuit.

In the manufacturing process, heat spreaders are formed by stamping or forging a single sheet of metal into an array of heat spreaders. The single sheet may yield tens or hundreds of heat spreaders. Each of the heat spreaders has the same contour and as they are separated from the sheet, they are stacked to reduce storage space and prepare them for the assembly process.

During assembly, the heat spreaders are singly selected from the stack for package attach. Occasionally the heat spreaders stick together in groups of two or more, causing a malfunction in the assembly line. The assembly line malfunctions may damage the package product or the assembly equipment. The sticking is promoted by the duplicate contours of the heat spreaders and sometimes the surface finish. The weight of the stack of heat spreaders tends to bend the lower devices in the stack causing a locking of forms in the heat spreader. An occurrence of the sticking issue may cause productivity loss, due to stopping the assembly machines, or yield loss due to damage sustained by the substrate or the integrated circuit.

Thus, a need still remains for an integrated circuit heat spreader stacking system. In view of the essential nature of the heat spreader and the demand for more function packed into the circuitry, it is increasingly critical that answers be found to these problems. In view of the ever-increasing commercial competitive pressures, along with growing consumer expectations and the diminishing opportunities for meaningful product differentiation in the marketplace, it is critical that solutions be found to resolve these issues. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit heat spreader stacking system including an integrated circuit on a substrate; a heat spreader having a heat sink dome; a stacking stand-off for the heat spreader; and the heat spreader mounted with the heat sink dome over the integrated circuit.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
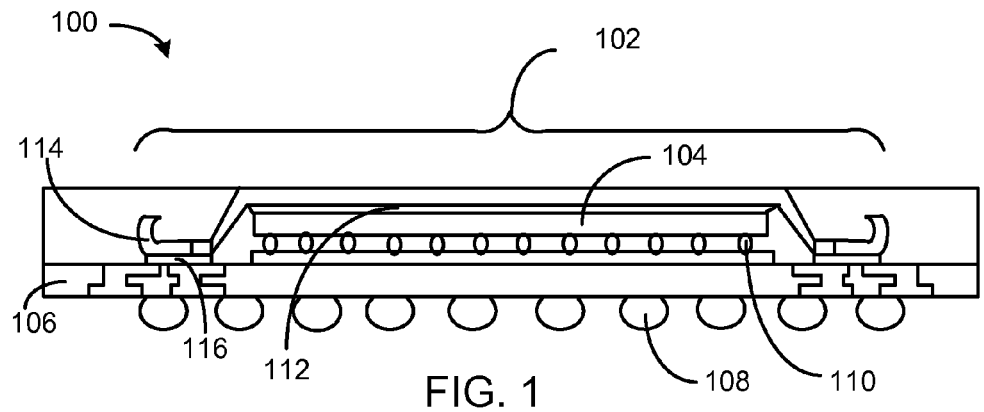
FIG. 1 is a cross-sectional view of an integrated circuit package, having the heat spreader, of FIG. 2.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package 100 having a heat spreader 102. The cross-sectional view of an integrated circuit package 100 depicts an integrated circuit 104 mounted on a substrate 106 having system interconnects 108. The integrated circuit 104 has electrical interconnects 110, such as solder balls, solder columns, or stud bumps, coupling the integrated circuit 104 to the substrate 106. An adhesive 112, such as a thermal epoxy, may optionally attach the heat spreader 102 to the integrated circuit 104. Thermal energy generated by the integrated circuit 104 passes through the heat spreader 102 for dissipation to the outside. The heat spreader 102 has a stacking stand-off 114 which may reduce assembly issues due to the heat spreader 102 sticking to others in a stack. In the installation process, a spreader adhesive 116 is placed between the stacking stand-off 114 and the substrate 106. The spreader adhesive 116 allows flexibility in adjusting for different thicknesses of the integrated circuit 104.

Figure 2:
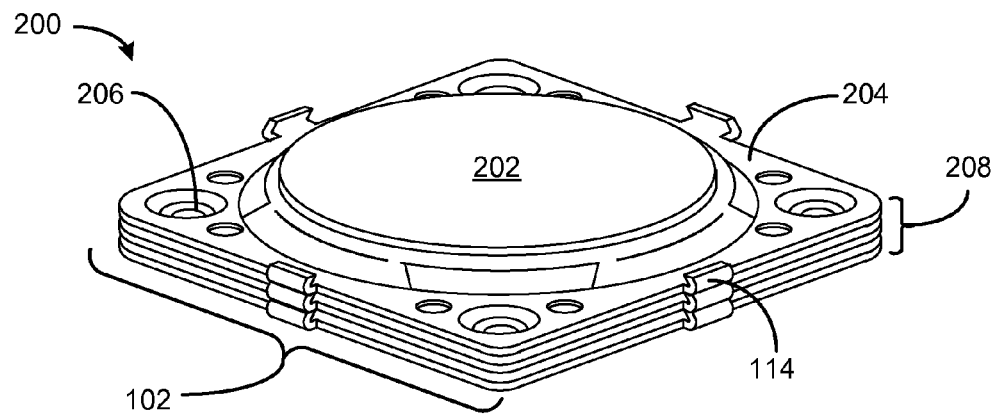
FIG. 2 is a perspective view of an integrated circuit heat spreader stacking system, in an embodiment of the present invention.

Referring now to FIG. 2, therein is shown a perspective view of an integrated circuit heat spreader stacking system 200, in an embodiment of the present invention. The perspective view of the integrated circuit heat spreader stacking system 200 depicts the heat spreader 102, stacked upon another heat spreader 102. The heat spreader 102 has a heat sink dome 202 in the center of its geometry. Located at substantially the center of each edge is a stacking stand-off 114. The stacking stand-off 114 is formed from the residual of a tiebar (not shown) from the original stamping of the heat spreader 102. A flat body 204 of the heat spreader 102 extends from the heat sink dome 202 to the stacking stand-off 114. The flat body 204 may have position support features 206 spaced around the heat sink dome 202. The position support features 206 are used to properly align the heat spreader 102 on a leadframe or the substrate 106, of FIG. 1. Additionally, using the position support features 206 reduces the amount of the spreader adhesive 116, of FIG. 1, required to attach the heat spreader 102 to the leadframe or the substrate 106.

The stacking stand-off 114 is shaped so that it is bent up and curved back over the flat body 204. When the heat spreader 102 is placed in a stack 208, the stacking stand-off 114 creates a gap or opening between the lower of the heat spreader 102 and the upper of the heat spreader 102. By having the heat spreader 102 spaced apart in the stack, it prevents the individual pieces from sticking together. The position of the stacking stand-off 114 may allow the position support features 206 to extend below the level of the flat body 204 of the lower unit of the heat spreader 102.

Figure 3:
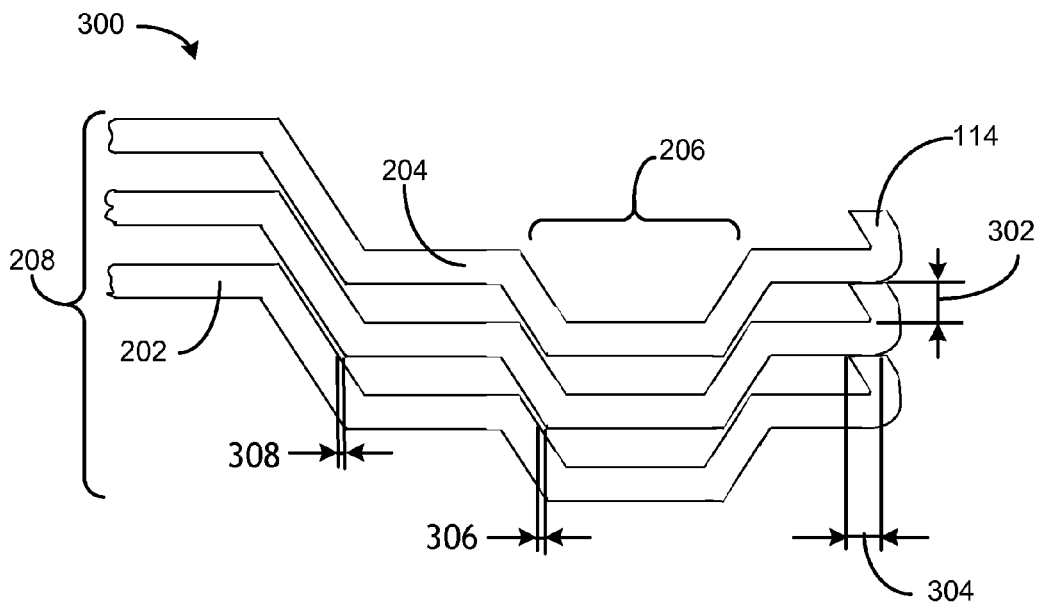
FIG. 3 is a cross-sectional view of the integrated circuit heat spreader stacking system with key dimensions indicated.

Referring now to FIG. 3, therein is shown a cross-sectional view of the integrated circuit heat spreader stacking system 300 with key dimensions indicated. The cross-sectional view of the integrated circuit heat spreader stacking system 300 depicts three units in the stack 208 of the heat spreader 102, of FIG. 1. The stacking stand-off 114 has established an offset height 302, while an overlap length 304 indicates the distance that the stacking stand-off 114 extends over the flat body 204. The offset height 302 and the overlap length 304 provide assurance that the individual pieces cannot slip out of the stacking position. The position support features 206 being vertically offset, creates a position support gap 306. The position support gap 306 must be less than overlap length 304. The offset height 302 also establishes a heat sink dome gap 308. The portion of the heat sink dome 202 that extends to the flat body 204 is separated by the heat sink dome gap 308. The heat sink dome gap 308 must also be less than the overlap length 304. In this way the stack 208 of the heat spreader 102 will not slip or bind, as the surfaces remain separated with the exception of the stacking stand-off 114.

Figure 4:
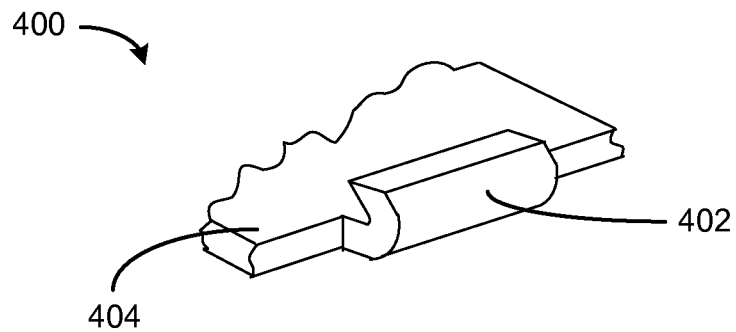
FIG. 4 is a partial view of the integrated circuit heat spreader stacking system, having a stacking stand-off.

Referring now to FIG. 4, therein is shown a partial view of the integrated circuit heat spreader stacking system 400, having a stacking stand-off 402. The partial view of the integrated circuit heat spreader stacking system 400 depicts a stacking stand-off 402 formed on an extension piece 404, such as a tiebar or edge extension. The stacking stand-off 402 is bent up and back over the extension piece 404. The stacking stand-off 402 establishes a vertical clearance between the pieces in the stack.

Figure 5:
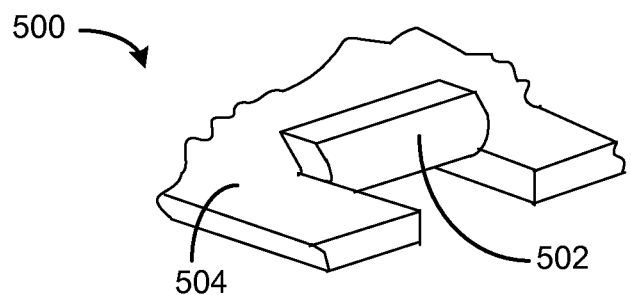
FIG. 5 is a partial view of the integrated circuit heat spreader stacking system, in an alternative embodiment of the present invention.

Referring now to FIG. 5, therein is shown a partial view of the integrated circuit heat spreader stacking system 500, in an alternative embodiment of the present invention. The partial view of the integrated circuit heat spreader stacking system 500 depicts a cutback stacking stand-off 502. The cutback stacking stand-off 502 is rolled up and back over a stacking surface 504, such as a tiebar, an edge of the flat body 204, or an extension tab. The cutback stacking stand-off 502 may be used to establish a vertical clearance between other units in the stack.

Figure 6:
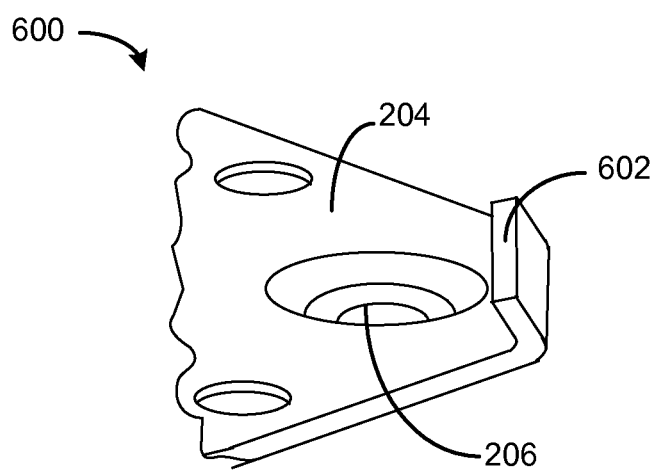
FIG. 6 is a partial view of the integrated circuit heat spreader stacking system, in another alternative embodiment of the present invention.

Referring now to FIG. 6, therein is shown a partial view of the integrated circuit heat spreader stacking system 600, in another alternative embodiment of the present invention. The partial view of the integrated circuit heat spreader stacking system 600 depicts the heat spreader 102 of FIG. 1 having a corner tab 602 which is extended from the flat body 204. The corner tab 602 is bent up and back over the flat body 204. The position of the corner tab 602 near the position support feature 206 provides a stable support as long as the lateral movement of the integrated circuit heat spreader stacking system 600 is limited by some other feature.

Figure 7:
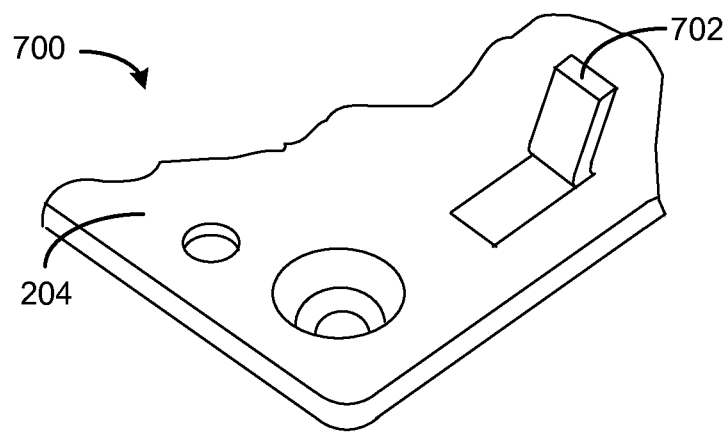
FIG. 7 is a partial view of the integrated circuit heat spreader stacking system, in yet another alternative embodiment of the present invention.

Referring now to FIG. 7, therein is shown a partial view of the integrated circuit heat spreader stacking system 700, in yet another alternative embodiment of the present invention. The partial view of the integrated circuit heat spreader stacking system 700 depicts the flat body 204 of the heat spreader 102 of FIG. 1 having a punched tab 702. The punched tab 702 may be of any width and positioned anywhere on the surface of the flat body 204. The punched tab 702 is formed by a section of the flat body 204 being punched and rolled up to a vertical position. The only restrictions on this embodiment are that it requires three or more of the punched tab 702, the stacking stand-off 114, of FIG. 1, or a combination thereof in order to form a stable offset mechanism. As with the other embodiments, the preferred number is four, though three or more may be possible.

Figure 8:
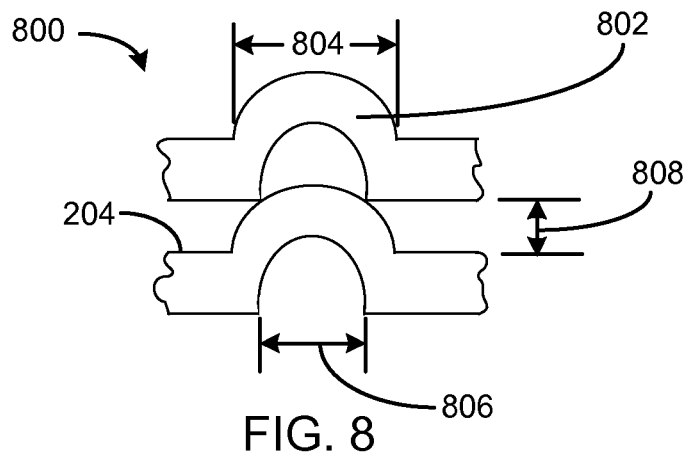
FIG. 8 is a partial view of the stacking stand-off, in an alternative embodiment of the present invention.

Referring now to FIG. 8, therein is shown a partial view of the stacking stand-off 800, in an alternative embodiment of the present invention. The partial view of the stacking stand-off 800 depicts the heat spreader 102 of FIG. 1 having a surface dimple 802, which may be formed at the time the heat spreader 102 is pressed from a single sheet of metal, such as copper, zinc, or an alloy of copper or zinc. The surface dimple 802 has an outer dimension 804 which must be larger than an inner dimension 806. In a stacking situation, the inner dimension 806 of the upper device cannot accept the outer dimension 804. This condition supplies a vertical displacement 808 to separate the devices.

Figure 9:
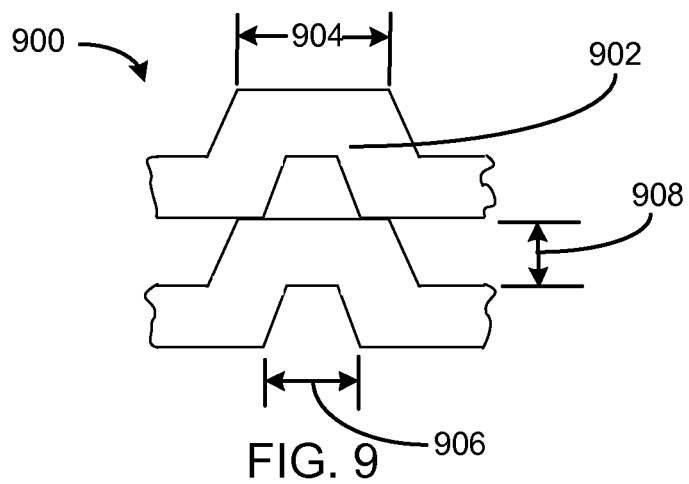
FIG. 9 is a partial view of the stacking stand-off, in another alternative embodiment of the present invention.

Referring now to FIG. 9, therein is shown a partial view of the stacking stand-off 900, in another alternative embodiment of the present invention. The partial view of the stacking stand-off 900 depicts a trapezoid stand-off 902. The trapezoid stand-off 902 may be formed at the time the heat spreader 102, of FIG. 1, is pressed from a single sheet of metal, such as copper, zinc, or an alloy of copper or zinc. The trapezoid stand-off 902 has a top width 904 which must be larger than a bottom width 906. In a stacking situation, the bottom width 906 of the upper device cannot accept the top width 904. This condition supplies a vertical displacement 908 to separate the devices.

Figure 10:
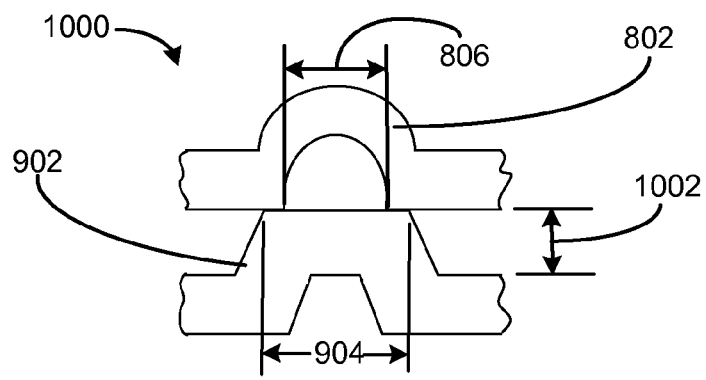
FIG. 10 is a partial view of the stacking stand-off, in yet another alternative embodiment of the present invention.

Referring now to FIG. 10, therein is shown a partial view of the stacking stand-off 1000, in yet another alternative embodiment of the present invention. The partial view of the stacking stand-off 1000 depicts the trapezoid stand-off 902 supporting the surface dimple 802. The surface dimple 802 has the opening width of the inner dimension 806 which is smaller than the top width 904 of the trapezoid stand-off 902. In a stacking situation, the inner dimension 806 of the upper device cannot accept the top width 904. This condition supplies a vertical displacement 1002 to separate the devices.

Figure 11:
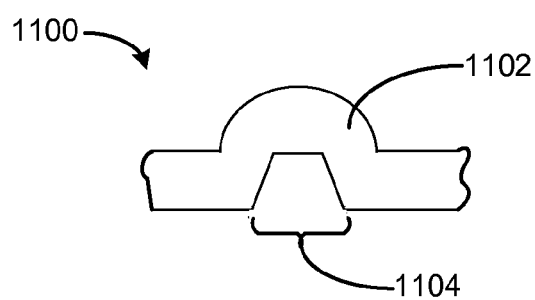
FIG. 11 is a partial view of the stacking stand-off, in still another alternative embodiment of the present invention.

Referring now to FIG. 11, therein is shown a partial view of the stacking stand-off 1100, in still another alternative embodiment of the present invention. The partial view of the stacking stand-off 1100 depicts a surface dome 1102 having a trapezoidal opening 1104. The stacking of such a stand-off provides a vertical separation between the devices, but there must be some lateral movement limits provided by another feature. The surface dome 1102 may be formed at the time the heat spreader 102, of FIG. 1, is pressed from a single sheet of metal, such as copper, zinc, or an alloy of copper or zinc.

Figure 12:
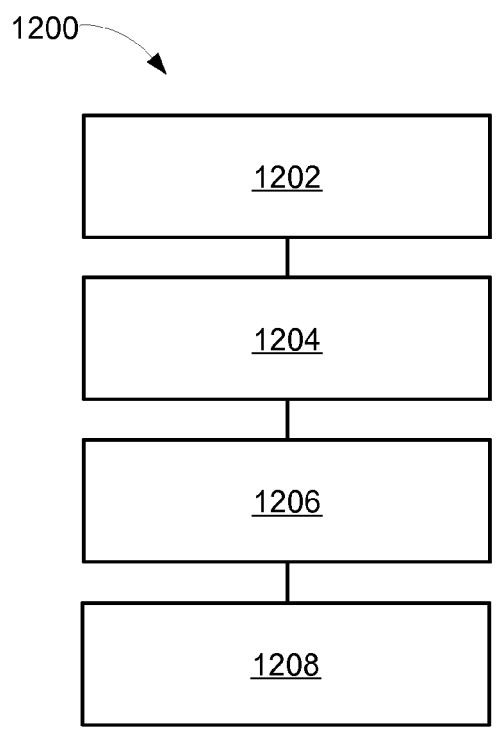
FIG. 12 is a flow chart of an integrated circuit heat spreader stacking system for the manufacture of an integrated circuit heat spreader stacking system in an embodiment of the present invention.

Referring now to FIG. 12, therein is shown a flow chart of an integrated circuit heat spreader stacking system 1200 for manufacturing the integrated circuit heat spreader stacking system in accordance with an embodiment of the present invention. The system 1200 includes mounting an integrated circuit on a substrate in a block 1202; forming a heat spreader in a block 1204; forming a stacking stand-off for the heat spreader in a block 1206; and mounting a heat spreader over the integrated circuit in a block 1208.

In greater detail, a system to provide an integrated circuit heat spreader stacking system, in an embodiment of the present invention, is performed as follows:

1. Mounting an integrated circuit on a substrate. (FIG. 1)
2. Forming a heat spreader. (FIG. 2)
3. Forming an extension piece for the heat spreader. (FIG. 2)
4. Bending a stacking stand-off from the extension piece. (FIG. 2)
5. Mounting the heat spreader over the integrated circuit. (FIG. 1)

It has been discovered that the present invention thus has numerous aspects.

It has been unexpectedly discovered that by adding a stacking stand-off to the heat spreader, to prevent heat spreader sticking, yield is increased and throughput is increased as well.

Another aspect is bent features in the heat spreader may be used to self-center the stack of the heat spreaders, without adding additional spacers or process steps.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit heat spreader stacking system of the present invention furnishes important and heretofore unknown and unavailable solutions, capabilities, and functional aspects for assembling integrated circuit packages with heat spreaders, in high volume. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit packages with heat spreaders fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit heat spreader system comprising:
   a substrate;
   an integrated circuit on the substrate;
   a heat spreader selected from a stack of heat spreaders and mounted over the integrated circuit, and the heat spreader having a heat sink dome formed above a flat body with a stacking stand-off, formed from the flat body, adjacent to a peripheral edge of and curved over the flat body,
   wherein said stacking stand-off prevents corresponding two neighboring heat spreaders in said stack from sticking together by providing a vertical displacement therebetween.

2. The system as claimed in claim 1 wherein the heat spreader includes a position support feature formed in the flat body.

3. The system as claimed in claim 1 wherein the heat spreader includes a corner tab.

4. The system as claimed in claim 1 wherein the heat spreader includes a punched tab.

5. The system as claimed in claim 1 wherein the heat spreader includes a surface dimple.

6. The system as claimed in claim 1 further comprising:
   an electrical interconnect coupled to the integrated circuit and the substrate; and wherein:
   the heat spreader is on the substrate;
   the stacking stand-off curved over the flat body by an overlap length; and
   the heat spreader over the integrated circuit has the flat body further comprising an extension piece.

7. The system as claimed in claim 6 wherein the heat spreader includes a corner tab over the flat body.

8. The system as claimed in claim 6 wherein the heat spreader includes a punched tab and is the flat body punched and rolled to a vertical position.

9. The system as claimed in claim 6 wherein the heat spreader includes a surface dimple for the vertical displacement in the stack.

* * * * *